(12) United States Patent
Banerjee et al.

(10) Patent No.: US 11,101,794 B2
(45) Date of Patent: Aug. 24, 2021

(54) BUS DRIVER WITH RISE/FALL TIME CONTROL

(71) Applicant: Texas Instruments Incorporated, Dallas, TX (US)

(72) Inventors: Deep Banerjee, Bengaluru (IN); Lokesh Kumar Gupta, Bengaluru (IN); Somshubhra Paul, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/889,939

(22) Filed: Jun. 2, 2020

(65) Prior Publication Data

US 2020/0295755 A1 Sep. 17, 2020

Related U.S. Application Data

(62) Division of application No. 15/834,599, filed on Dec. 7, 2017, now Pat. No. 10,707,867.

(60) Provisional application No. 62/577,855, filed on Oct. 27, 2017.

(51) Int. Cl.
| | |
|---|---|
| *H04L 12/40* | (2006.01) |
| *G05F 3/26* | (2006.01) |
| *H03K 17/16* | (2006.01) |
| *H03K 17/30* | (2006.01) |
| *H03K 17/687* | (2006.01) |

(52) U.S. Cl.
CPC ......... *H03K 17/6871* (2013.01); *G05F 3/262* (2013.01); *H03K 17/163* (2013.01); *H03K 17/302* (2013.01); *H04L 12/4013* (2013.01); *H04L 2012/40234* (2013.01)

(58) Field of Classification Search
CPC .. H03K 17/687; H03K 17/6871; H03K 17/30; H03K 17/16; G05F 3/26; G05F 3/262; H04L 12/4013
See application file for complete search history.

(56) References Cited

U.S. PATENT DOCUMENTS

| | | | |
|---|---|---|---|
| 7,088,151 B1 | 8/2006 | Dequina et al. | |
| 7,218,170 B1 * | 5/2007 | Carter | G05F 3/262 |
| | | | 323/315 |
| 8,860,398 B2 * | 10/2014 | Mulligan | H02M 3/155 |
| | | | 323/315 |
| 9,602,079 B2 * | 3/2017 | Ranjan | H03H 11/1291 |

(Continued)

*Primary Examiner* — Patrick C Chen
(74) *Attorney, Agent, or Firm* — Ray A. King; Charles A. Brill; Frank D. Cimino

(57) ABSTRACT

A driver includes an open drain output transistor, a capacitor, a first current source, and first and second transistors. Upon assertion of a transmit signal to turn on the first transistor, a controller asserts a second control signal to turn on the second transistor responsive to a voltage of the capacitor being less than a threshold voltage of the open drain output transistor to thereby increase the control terminal voltage for the open drain output transistor at a first time rate. The controller deasserts the second control signal to turn off the second transistor responsive to the capacitor voltage exceeding the threshold voltage. Responsive to the capacitor's voltage exceeding the threshold, the first current source charges the capacitor to further increase the control terminal voltage at a second time rate that is smaller than the first time rate.

15 Claims, 3 Drawing Sheets

(56) References Cited

U.S. PATENT DOCUMENTS

2011/0193613 A1    8/2011  Berkhout
2018/0248476 A1*   8/2018  Harvey ................... H03K 17/16
2018/0348805 A1*  12/2018  Elsayed .................. G05F 1/468

* cited by examiner

BUS DRIVER WITH RISE/FALL TIME CONTROL

RELATED APPLICATIONS

This application is a division of U.S. patent application Ser. No. 15/834,599, filed Dec. 7, 2017, which claims priority to U.S. Provisional Application No. 62/577,855, filed Oct. 27, 2017, titled "A Wide Supply Range, Process and Temperature Insensitive Driver," the contents of which are herein incorporated by reference in its entirety.

BACKGROUND

An electrical driver often is used to drive a signal on a bus in accordance with an applicable bus specification. For example, the Local Interconnect Network (LIN) is a single wire, bidirectional bus for automotive networks. A LIN driver can be used to transmit serial data within a vehicle. The LIN specification (e.g., ISO/DIS 17987-4.2) and other requirements may impose various restrictions for a LIN driver. For example, the rise and fall times of the LIN driver output signal should be within a relatively narrow window rise and fall times that are too fast may generate unacceptably high radio frequency emissions and rise and fall times that are too slow may complicate compliance with duty cycle requirements and may cause high switching losses. Further, in the face of a short circuit condition, the automobile's battery may be drained and the UN driver may be damaged.

SUMMARY

In one aspect of the disclosure, an electrical driver includes an open drain output transistor, a capacitor, a first current source, a second transistor, and a controller. The capacitor is coupled to a gate of the open drain output transistor. The first current source is coupled to the capacitor through a first transistor. The second transistor is coupled to the gate of the open drain output transistor and the capacitor. The controller is configured to control a state of the second transistor. Upon assertion of a transmit signal to turn on the first transistor, the controller asserts a second control signal to turn on the second transistor responsive to a voltage of the capacitor being less than a threshold voltage of the open drain output transistor to thereby increase the gate voltage for the open drain output transistor at a first time rate. The controller subsequently deasserts the second control signal to turn off the second transistor responsive to the capacitor voltage being greater than the threshold voltage. Responsive to the capacitor's voltage exceeding the threshold voltage of the open drain output transistor, current from the first current source charges the capacitor to thereby further increase the gate voltage for the open drain output transistor at a second time rate. The second time rate is smaller than the first time rate.

In another aspect of the disclosure, an electrical driver includes an open drain output transistor and a capacitor coupled to a gate of the open drain output transistor. The driver also includes a first transistor to be turned on and off through assertion of a transmit signal. A first current source couples to the capacitor through the first transistor. The first current source is to source current to the capacitor when the first transistor is on. A second current source is coupled to the capacitor. The second current source is to sink current from the capacitor.

In yet another aspect of the disclosure, an electrical driver includes a first transistor having a first size. A first current source is included to provide a first current through the first transistor. An open drain output transistor has a second size that is larger than the first size of the first transistor. The open drain output transistor is coupled to the first transistor in a current mirror configuration. When the open drain output transistor is on, drain-to-source current through the open drain output transistor is limited by the first current through the first transistor

BRIEF DESCRIPTION OF THE DRAWINGS

For a detailed description of various examples, reference will now be made to the accompanying drawings in which.

DETAILED DESCRIPTION

Figure 1:
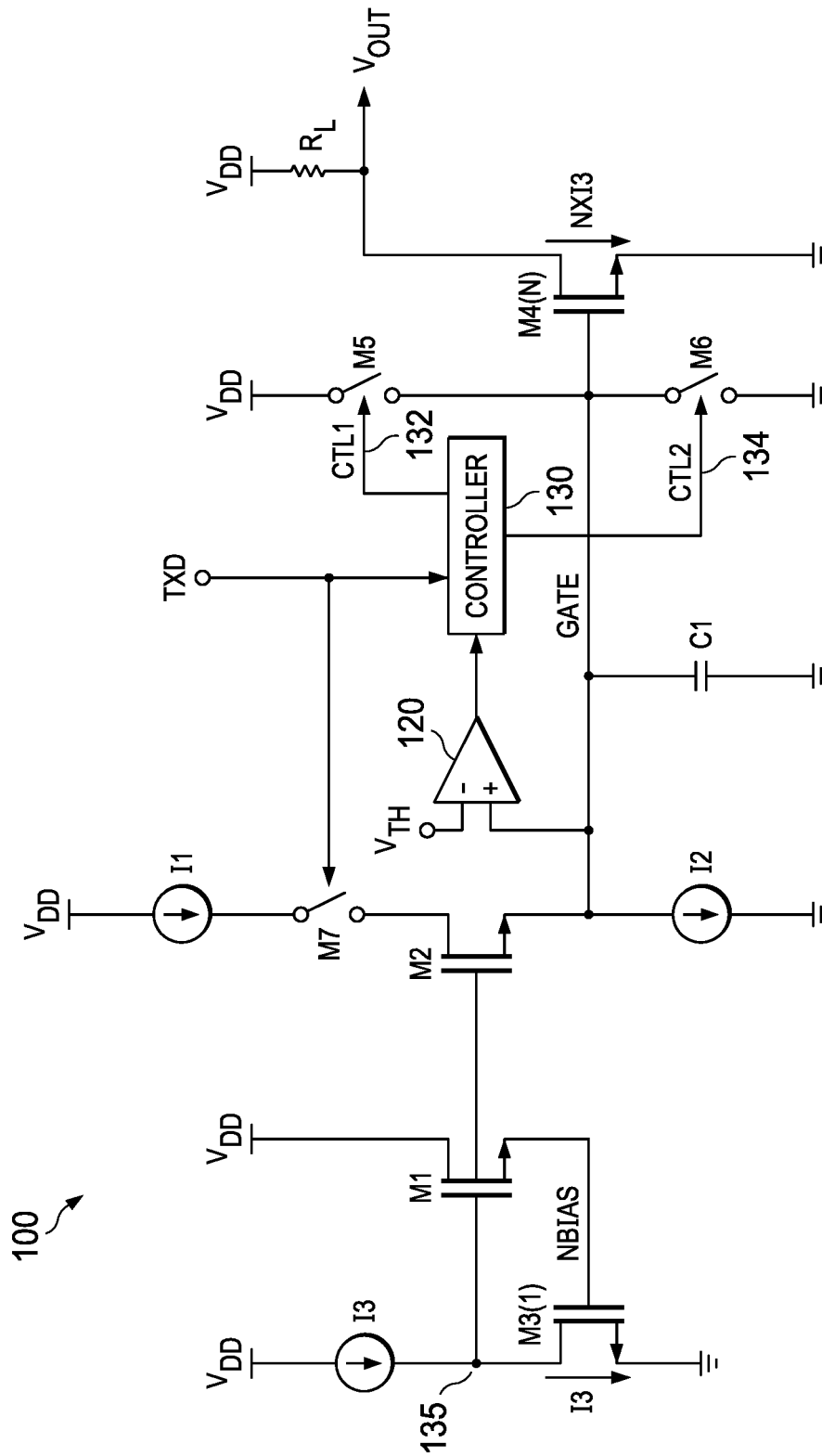
FIG. 1 illustrates an electrical driver in accordance this disclosure.

As noted above, a driver such as a LIN driver may need to adhere to specified limits on rise and fall times. Further, a LIN driver should be current-limited to avoid damage to the driver in the face of a short circuit condition. Further still, it may be desirable for the driver to be process, temperature, and voltage supply insensitive, and to operate from a wide voltage supply range (e.g., 4V to 48V).

In accordance with the disclosed examples, an electrical driver satisfies one or more or all of the aforementioned conditions. In one example, the driver comprises an open drain output transistor. An external (e.g. external to the package containing the driver) pull-up resistor can be connected to the drain of the output transistor. When the output transistor is off (e.g., its gate voltage is low), the transistor's output voltage (on its drain) is pulled high by the pull-up resistor. When the output transistor is on (e.g., its gate is high), the transistor's output voltage is pulled low by way of a ground connection to the transistor's source.

A capacitor is coupled to the gate of the output transistor. Accordingly, the voltage on the capacitor is also the gate voltage for the output transistor. When a transmit signal is asserted (e.g., low), a switch is closed by the transmit signal thereby connecting a current source to the capacitor. The current source includes a resistor and the current magnitude of the current source is inversely proportional to the resistance value of the resistor. The current source's current charges the capacitor. Upon initial assertion of the transmit signal, a controller within the driver closes a pull-up switch that connects the supply voltage to the gate of the output transistor thereby increasing the gate voltage at a relatively high rate. Once the gate voltage reaches the threshold voltage of the output transistor, which causes the output transistor to begin to turn on, the controller turns off the pull-up switch thereby causing the gate voltage to continue increasing from the increasing voltage on the capacitor as it is being charged by the current source. The value of the resistance in the current source and the capacitance of the capacitor being charged by the current source controls the rate at which the voltage on the capacitor increases. The values of resistance and capacitance are selected to cause the capacitor's voltage, and thus the gate voltage, to increase at a rate that is smaller than the initial relatively high rate. The values of resistance and capacitance are selected to carefully control the rising and falling edges of the voltage on the drain of the output transistor.

When the transmit signal is subsequently deasserted, the voltage on the gate of the output transistor begins to fall as the capacitor begins to discharge through another current source whose current also is inversely proportional the resistance value noted above. Thus, the rate at which the gate voltage falls also is smaller than the initial relatively high rate noted above. Once the gate voltage falls below the output transistor's threshold voltage, thereby turning off the output transistor, the controller asserts another control signal to another switch that couples the output transistor's gate to ground, thereby causing the gate voltage to decrease at a rapid rate (e.g., much more rapid than the rate at which the gate voltage decreases while the output transistor is still on).

FIG. 1 illustrates an example of a driver 100 in accordance with this disclosure. The driver includes transistors M1, M2, M3, M4, M5, M6, and M7, capacitor C1, current sources I1, I2, and I3, comparator 120, and controller 130. Transistor M4 is an open drain output transistor. The voltage on the drain of M4 is the output signal Vout from the driver. An output resistor $R_L$ is connected between the drain of M4 and a supply voltage $V_{DD}$. The output resistor $R_L$ is thus a pull-up resistor. Vout is a logic high when M4 is off and a logic low when M4 is on. The output resistor $R_L$ may be a resistor that is external to the integrated circuit (IC) containing M4, or may be integrated into the same IC containing M4. As a separate component, $R_L$ may be mounted on a printed circuit board to which the IC containing M4 also is mounted.

In the example of FIG. 1, the gate of M4 is connected to M5, M6, capacitor C1, current source I2 and the source of M2. The node comprising the connection point between these components is designated as GATE in FIG. 1. GATE also is coupled to an input (e.g., positive input) of comparator 120.

The drain of M2 is connected to M7, with the opposing terminal of M7 connected to current source I1. Current source I3 is connected to the drain of M3 and the source of M3 is connected to ground. The source of M1 is connected to the gate of M3, and the node 135 connecting I3 to M3 is connected to the gates of M1 and M2. M5 and M6 connect the GATE node to VDD or ground, respectively, depending on which transistor is turned on by the controller 132. The controller 132 asserts control signal CTL1 132 and CTL2 134 to the gates of M5 and M6, respectively. A threshold voltage Vth is provided to the negative input of comparator 120 and the output of the comparator 120 is provided to the controller 130. The threshold voltage Vth is approximately equal to the threshold voltage of M4.

Current from I1 flows through M7 and M2, when M7 and M2 are on, to capacitor C1 to charge the capacitor as well to current source I2. The current produced by I1 is produced, as described below, to have a magnitude equal to 2×(NBIAS−Vth)/R. NBIAS is a bias voltage shown on the gate of M3 and is generated as described below and represents the maximum voltage to which the capacitor C1 can be charged. The value of R is the resistance value of a resistor within the current source I1. The I2 current source is set at (NBIAS−Vth)/R. Thus, half of the current (2×(NBIAS−Vth)/R) from I1 flows through I2 and the other half flows to the capacitor C1.

Transistor M7 is a switch that is turned on (closed) or off (open) based on a transmit signal TXD, which is the input signal to the driver. A high logic state for TXD causes M7 to be off and a low logic state for TXD causes M7 to be turned on. Broadly speaking, with TXD high, M7 is off, and thus the GATE node is low which causes M4 to be off and resistor $R_L$ pulls Vout high. With TXD low, M7 is on, and current from I1 charges the capacitor C1 to thereby increase the voltage on the GATE node which, in turn, turns on M4 and pulls Vout low.

As noted above, when TXD is low, M7 is turned on and the current from I1 begins to charge the capacitor C1. I1 is 2×(NBIAS−Vth)/R. The voltage on the capacitor C1 increases generally linearly as a function of current I1 and the capacitance of capacitor C1. Specifically, the ratio of the current through the capacitor to its capacitance defines the rate at which the voltage increases across a capacitor. For capacitor C1, the rate at which the voltage across the capacitor increases is thus (NBIAS−Vth)/(RC). As such, the capacitor's voltage is forced to increase from Vth to NBIAS in RC seconds. That is, as M4 is being turned on, the rate at which its gate voltage increases between the threshold voltage (Vth) and the maximum gate voltage (NBIAS) is dictated by the product of R and C. Thus, the values of R and C are chosen to control the rate at which M4 turns on and off. Because the rate at which M4 turns on and off also governs the rising and falling edges of Vout, the values of R and C also control the rising and falling edges of Vout, and thus values of R and C can be chosen so as to cause a desired slope of the Vout rising and falling edges. The rise/fall times of Vout are thus only dependent on the product of R and C which is relatively independent of process & temperature, and completely independent of the supply voltage.

When the voltage on the GATE node is below M4's threshold voltage (Vth), M4 is not on and the rate at which the gate voltage changes in that state is not relevant to the slope of Vout's rising or falling edges. Accordingly, the rate at which the voltage on the GATE node changes when it is below Vth can be set at a higher level than when the GATE node voltage is between Vth and NBIAS. The time taken to charge and discharge the GATE node between 0 to Vth should be as small as possible since it corresponds to a "dead-zone" in the driver output. Moreover Vth, and hence this dead-zone duration, is dependent on process and temperature. As a result, it is helpful to minimize this dead-zone duration. M5 and M6 are used to increase and decrease, respectively, the GATE node voltage when the voltage is less than Vth.

Figure 2:
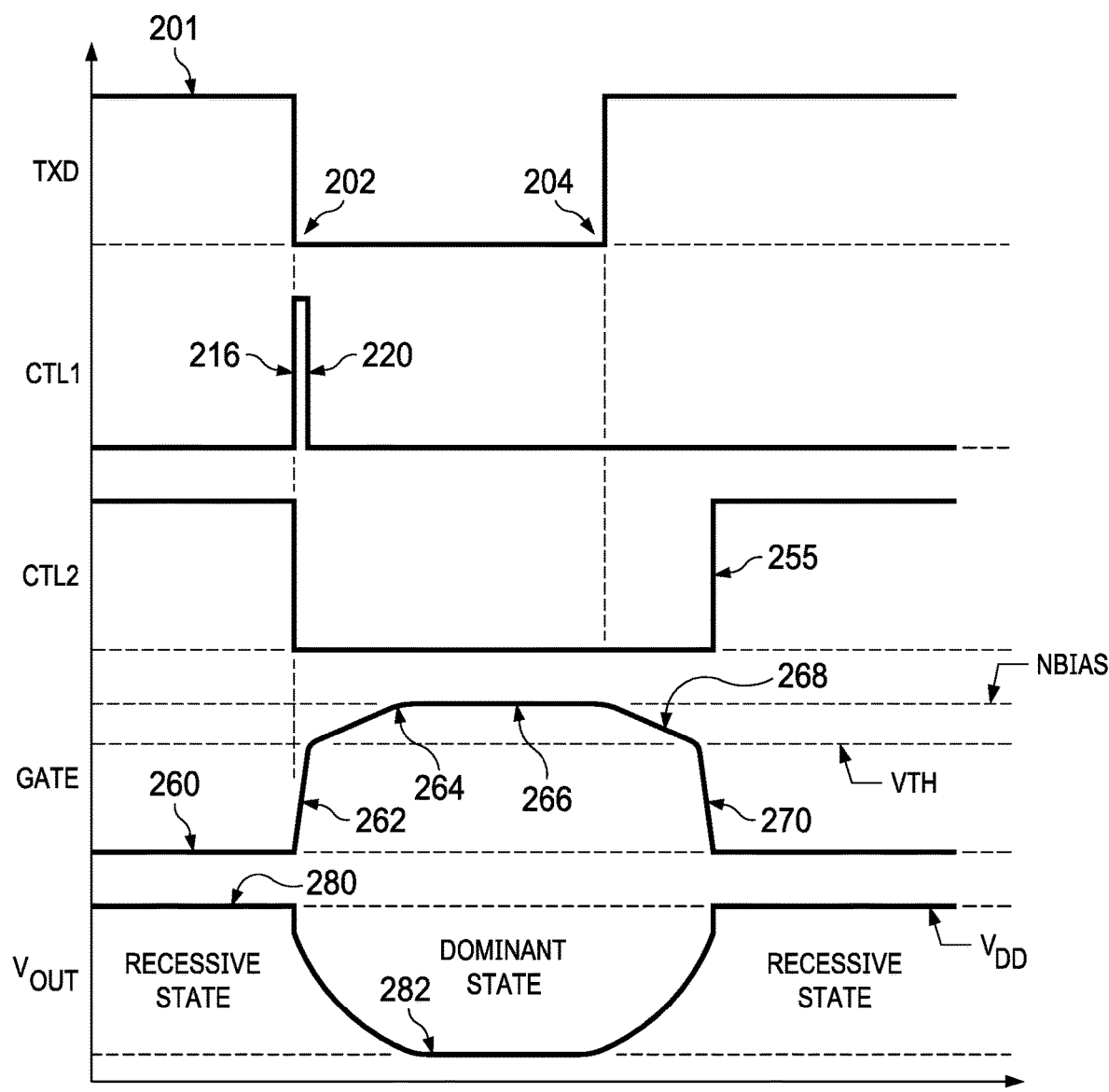
FIG. 2 depicts waveforms of signals within the electrical driver in accordance with this disclosure.

FIG. 2 illustrates the waveforms of various signals within the driver 100. The signals illustrated in FIG. 2 include TXD, CTL1, CTL2, GATE (the voltage on the GATE node), and Vout. Referring both to FIGS. 1 and 2, the TXD signal is shown to transition to a low state at 202 and then back to a high state at 204. When TXD is high (e.g., at 201), M7 is off, GATE is low (e.g., at 260), M4 is off, and Vout is high (e.g., at 280) as explained above. Upon the transition of TXD to a logic low, the controller 130 (which also receives the TXD signal) asserts CTL1 132 to turn on M5 (as illustrated at 216) thereby providing the supply voltage $V_{DD}$ through M5 to the GATE node. The voltage on the GATE node thereby increases rapidly as shown at 262. The comparator 120 compares the relative levels of Vth to the GATE node voltage and provides the comparator's output signal (e.g., logic high when GATE is greater than Vth, and logic low when GATE is less than Vth) to the controller 130. Once the GATE node voltage reaches the threshold voltage Vth of M4, the output of the comparator 120 changes state and the controller 130 responds by deasserting CTL1 to thereby turn off M5 at 220.

The voltage on the GATE node, however, continues to increase at 264 due to the charging capacitor C1 albeit at a lower rate than at 262. The rate of increase at 264 is a function of the product of R (resistance of a resistor within I1) and C (capacitance of C1) as explained above. The GATE voltage reaches its maximum of NBIAS at 266.

Upon TXD transitioning back to a high state at 204, M7 is turned off which causes capacitor C1 to begin to discharge through current source I2. As noted above, current source I2 is set to (NBIAS−Vth)/(RC), which causes the GATE node voltage to fall linearly as shown at 268. The slope at 268 is approximately the same as at 264 albeit it negative instead of positive. Once the GATE node voltage falls below Vth (a condition detected by the comparator 120), the controller 130 asserts control signal CTL2 134 as shown at 255 to close M6 which pulls the GATE node voltage down hard to ground as shown at 270. The rate of decrease at 270 is greater than at 268.

According to the LIN standard, the output voltage at the drain of M4 being low is referred to as the dominant state, and the output voltage being high ($V_{DD}$) is referred to as the recessive state. To ensure that the driver's output voltage is in the dominant state, the voltage on M4's drain (identified at 282) should be less than $0.2 \times V_{DD}$.

Figure 3:
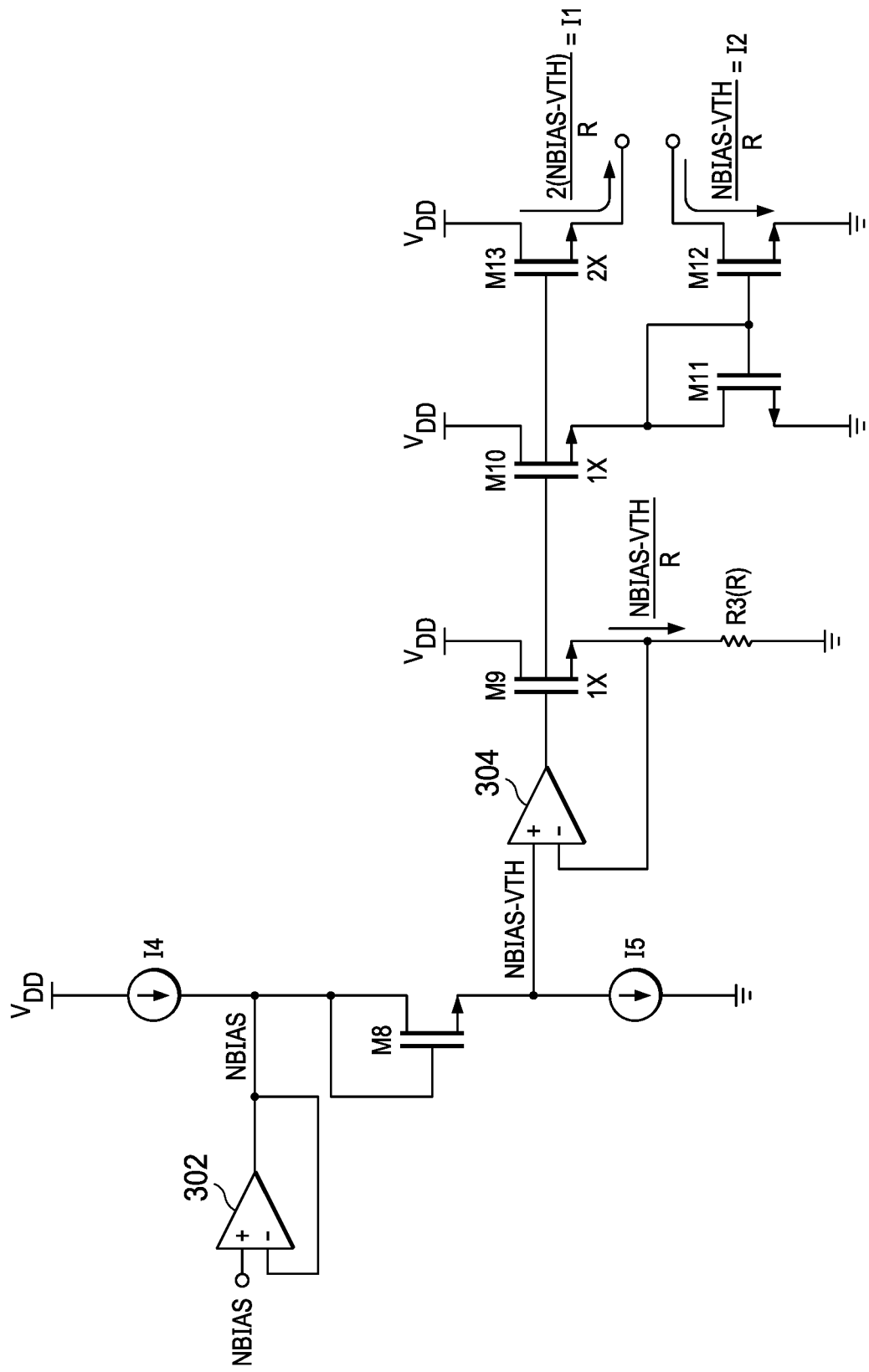
FIG. 3 shows an example of a circuit that generates the I1 and I2 current in the electrical driver of FIG. 1.

FIG. 3 shows a circuit for the generation of the I1 and I2 currents of FIG. 1. As explained above, I1 is 2×(NBIAS−Vth)/R and I2 is half the magnitude of I1, that is, (NBIAS−Vth)/R. The circuit of FIG. 4 includes operational amplifiers 302 and 304, current sources I4 and I5, transistors M8, M9, M10, M11, M12, and M13, and resistor R3. The resistance of resistor R3 is the value R noted above. Operational amplifier 302 is configured as a voltage follower. The NBIAS voltage is provided to the non-inverting input of the operational amplifier 302 and its output terminal also carries the NBIAS voltage. The operational amplifier's output is connected to the drain of M8 and to current source I4. The source of M8 is connected to current source I5. I4 & I5 are used to bias transistor M8 in subthreshold region, thus ensuring the drop across M8 is approximately equal to Vth. Hence the current values for I4 and I5 are selected to be relatively small. Transistor M8 is approximately equal to M3 of FIG. 1 meaning the size of M8 is approximately the same as M3. Thus, the threshold voltage of M8 is approximately the same as for M3 as well as for M4, and the voltage on the source of M8, which is provided to operational amplifier 304 is (NBIAS−Vth). The output of operational amplifier 304 is connected to the gates of transistors M9, M10, and M13 as shown in the example of FIG. 3. Transistor M9 has a size of 1×. Transistor M10 is the same size as M9 (i.e., 1×), but transistor M13 is twice the size of M9 (i.e., 2×). The drain-to-source current through M9 is (NBIAS−Vth)/R. Similarly, the drain-to-source current of M10 also is (NBIAS−Vth)/R because M10 is of the same size as M9. Transistors M11 and M12 are configured as a current mirror and thus the drain-to-source current of M12 also is (NBIAS−Vth)/R, which is the current represented by I2 in FIG. 1. Because M13 is twice the size of M9, the drain-to-source current of M13 is 2×(NBIAS−Vth)/R, which is the current represented by I1 in FIG. 1. Referring again to FIG. 1, current source I3 is set at $V_{DD}$/R, where R is chosen to ensure the output voltage is smaller than, for example, 0.2*VDD as described below. Transistor M3 is made from the same process and on the same semiconductor substrate as M4 but M4 is N times larger than M3. Further, because of the source follower pair M1 and M2, the maximum voltage at the gate of M4, in the dominant state, is NBIAS, which is the gate voltage of M3. The NBIAS voltage is dependent on process, temperature and/or supply voltage. Hence, it is helpful to charge and discharge the gate capacitor of M4 using a current which is (NBIAS−Vth)/R. Otherwise, if a bandgap-based current was used to charge/discharge the gate capacitor, the rise/fall times may be a function of the process and temperature variations as well as dependent on supply voltage. M3 and M4 generally form a current mirror whereby the drain-to-source current through M3 is reflected as well through M4, albeit N times as large. Thus, as the current through I3 is $V_{DD}$/R, when M4 is on the current through M4 is $N \times V_{DD}/R$. The output voltage Vout is thus $V_{DD} - V_{DD} \times R_L \times N/R$. Thus, the output voltage Vout scales with the supply voltage $V_{DD}$. If $N \times R_L/R$ is greater than a desired value, the output voltage will always be less than a desired percentage of $V_{DD}$ regardless of the magnitude of $V_{DD}$. For example, as noted above the LIN standard requires that when the driver is in the dominant state, the output voltage should be less than $0.2 \times V_{DD}$. Accordingly, the dominant state is ensured for the example driver circuit of FIG. 1 if $N \times R_L/R$ is greater than 0.8. Thus, the parameters that affect the driver's output voltage during the dominant state is N (size of the output transistor M4 relative to M3), $R_L$ (size of the pull-up resistor) and R, but not the magnitude of the supply voltage $V_{DD}$. Also, because of the current mirror comprising M3 and M4, the current through M4 is limited by current source I3 and N, the relative size ratio of M4 to M3. The current mirror thus also functions as a current limiter during, for example, a short circuit condition.

Transistors M1 and M2 form a source follower circuit. The source of M1 also is the NBIAS voltage. Because the gates of M1 and M2 are connected together and M1 and M2 are of the same size, the maximum voltage on the GATE node does not exceed NBIAS. This configuration limits the voltage to which the capacitor C can be charged to NBIAS.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various example implementations according to this disclosure. Numerous variations and modifications will become apparent to those skilled in the art once the above disclosure is fully appreciated. It is intended that the following claims be interpreted to embrace all such variations and modifications.

What is claimed is:
1. An electrical driver, comprising:
an output transistor having a first current terminal, a second current terminal and a control terminal;
a capacitor coupled to the control terminal of the output transistor;
a first transistor having a first current terminal, a second current terminal and a control terminal;
a first current source coupled to the capacitor through the current terminals of the first transistor;

a second transistor coupled to the control terminal of the output transistor and the capacitor;
a third transistor coupled between ground and the control terminal of the output transistor;
a current mirror that includes:
   the output transistor;
   a fourth transistor; and
   a second current source coupled to the fourth transistor;
   wherein current through the output transistor is proportional to a magnitude of the current of the second current source; and
a controller configured to control a state of the second transistor and the third transistor;
wherein, upon assertion of a transmit signal to turn on the first transistor, the controller asserts a second control signal to turn on the second transistor responsive to a voltage of the capacitor being less than a threshold voltage of the output transistor to thereby increase the control terminal voltage for the output transistor at a first time rate, and then deasserts the second control signal to turn off the second transistor responsive to the capacitor voltage being greater than the threshold voltage;
wherein responsive to the capacitor's voltage exceeding the threshold voltage of the output transistor, current from the first current source charges the capacitor to further increase the control terminal voltage for the output transistor at a second time rate, wherein the second time rate is smaller than the first time rate; and
wherein upon deassertion of the transmit signal to turn off the first transistor, the controller determines when the capacitor's voltage falls below the threshold of the output transistor and asserts a third control signal to the third transistor to couple the control terminal of the output transistor to ground.

2. The electrical driver of claim 1, further including a second current source coupled to the capacitor, wherein upon deassertion of the transmit signal to turn off the first transistor and before the capacitor's voltage falls below the threshold of the output transistor, the capacitor begins to discharge through the second current source to reduce the capacitor's voltage at the second time rate.

3. The electrical driver of claim 1, wherein the first current source includes a resistor R and generates a current inversely proportional to the resistance of resistor R, and wherein the second time rate at which the capacitor's voltage increases responsive to the capacitor's voltage exceeding the threshold voltage of the open drain output transistor is proportional to a product of the resistance of resistor R and the capacitance of the capacitor.

4. The electrical driver of claim 1, wherein the current through the output transistor is proportional to a magnitude of the current of the second current source and a ratio of the sizes of the output transistor to the fourth transistor.

5. The electrical driver of claim 1, wherein a maximum current level through the output transistor is limited by the current mirror.

6. The electrical driver of claim 1, wherein the fourth transistor is fabricated on the same semiconductor substrate as the output transistor, and wherein the output transistor includes N repetitions of the fourth transistor connected in parallel, wherein N is greater than 1.

7. The electrical driver of claim 1, further including a circuit coupled to the capacitor that recreates a voltage that is the maximum voltage to which the capacitor can be charged.

8. The electrical driver of claim 1, wherein the electrical driver is a Local Interconnect Network (LIN).

9. An electrical driver, comprising:
an output transistor;
a capacitor coupled to a control terminal of the output transistor;
a first transistor to be turned on and off through assertion of a transmit signal;
a first current source coupled to the capacitor through the current terminals of the first transistor, the first current source to source current to the capacitor when the first transistor is on;
a second current source coupled to the capacitor, the second current source to sink current from the capacitor when the first transistor is off;
a second transistor coupled between a voltage supply node and the control terminal of the output transistor, and controlled to turn on upon detection of an assertion of the transmit signal and that a voltage on the control terminal of the output transistor is below its threshold voltage;
a third transistor coupled between the control terminal of the output transistor and a ground node, and controlled to turn on the third transistor upon detection of a de-assertion of the transmit signal and that a voltage on the control terminal of the output transistor is below its threshold voltage; and
a fourth transistor coupled to a third current source, wherein the fourth transistor and the output transistor form a current mirror, and wherein, when the fourth transistor is on, current through the output transistor is limited by the third current source.

10. The electrical driver of claim 9, including a controller configured to turn on the second transistor upon detection of an assertion of the transmit signal and that a voltage on the control terminal of the output transistor is below its threshold voltage.

11. The electrical driver of claim 9, wherein the controller is further configured to turn on the third transistor upon detection of a de-assertion of the transmit signal and that a voltage on the control terminal of the output transistor is below a threshold voltage.

12. The electrical driver of claim 9, wherein:
the fourth transistor has a first size; and
the output transistor has a second size larger than the first size.

13. The electrical driver of claim 9, further including a comparator and a controller, wherein the comparator compares a threshold voltage to a voltage on the control terminal of the output transistor and provides a comparator output signal to the controller.

14. The electrical driver of claim 13, wherein the controller is further configured to:
assert a first control signal to turn on the second transistor upon detection of a de-assertion of the transmit signal and that the comparator output signal indicates that a voltage on the control terminal of the output transistor is below a threshold voltage of the output transistor;
deassert the first control signal to turn off the second transistor responsive to the comparator output signal indicating that the voltage on the control terminal of the output transistor is above the threshold voltage of the output transistor;
assert a second control signal to turn on the third transistor upon detection of a deassertion of the transmit signal and responsive to the comparator output signal indicating that the voltage on the control terminal of the output transistor has fallen below the threshold voltage of the output transistor.

15. The electrical driver of claim 9, further including a circuit coupled to the capacitor that generates a voltage that is the maximum voltage to which the capacitor can be charged.

* * * * *